United States Patent [19]

Boschet et al.

[11] Patent Number: 4,918,684
[45] Date of Patent: Apr. 17, 1990

[54] DEVICE FOR THE MEASUREMENT OF INTERMODULATION PRODUCTS OF A RECEIVER SYSTEM

[75] Inventors: Christian Boschet, St Orens de Gameville; Jacques Sombrin, Toulouse, both of France

[73] Assignee: Centre National d'Etudes Spatiales, Paris, France

[21] Appl. No.: 249,445

[22] Filed: Sep. 26, 1988

[30] Foreign Application Priority Data

Sep. 25, 1987 [FR] France .................. 87 13317

[51] Int. Cl.⁴ ................................. H04B 7/14
[52] U.S. Cl. .......................... 370/17; 370/123
[58] Field of Search ............... 370/17, 70, 120, 123, 370/13; 455/226; 342/165, 168, 169, 170, 173

[56] References Cited

U.S. PATENT DOCUMENTS

| | | | |
|---|---|---|---|
| 3,467,866 | 9/1969 | Palatinus ........................ | 325/67 |
| 3,895,191 | 7/1975 | Koganezawa et al. ........ | 455/226 |
| 4,029,902 | 6/1977 | Bell, Jr. et al. ................ | 370/123 |
| 4,815,075 | 3/1989 | Cameron ........................ | 370/123 |

FOREIGN PATENT DOCUMENTS 681673 4/1951 United Kingdom .

OTHER PUBLICATIONS

"Comments on Discriminator Theory", Ashley et al., *IEEE Transactions on Microwave Theory and Techniques*, vol. MIT-31, No. 7, Jul. 1983, pp. 605-606.

Primary Examiner—Douglas W. Olms
Assistant Examiner—Melvin Marcelo
Attorney, Agent, or Firm—Steven F. Caserza

[57] ABSTRACT

A device to measure intermodulation products of a receiver of at least two electromagnetic signals of different frequencies comprises at least two channels for the transmission of the signals of different frequencies and one reflective reception channel connected to an apparatus for the measurement of intermodulation products. The reception channel enables the transfer of signals in a frequency band centered on the reception frequency band of the receiver. A reflective reception multiplexer/demultiplexer with directional filters provides for the interconnection of the two transmission channels of the reflective reception channel of the receiver.

14 Claims, 3 Drawing Sheets

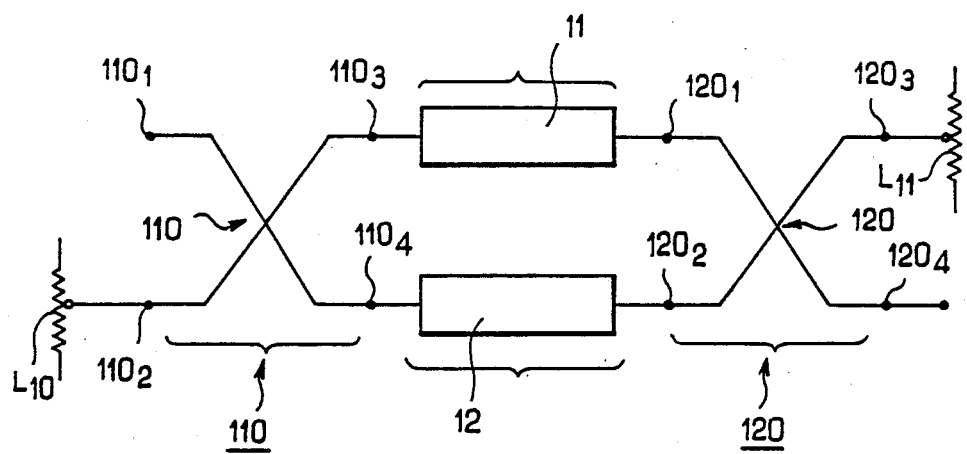
FIG_1b

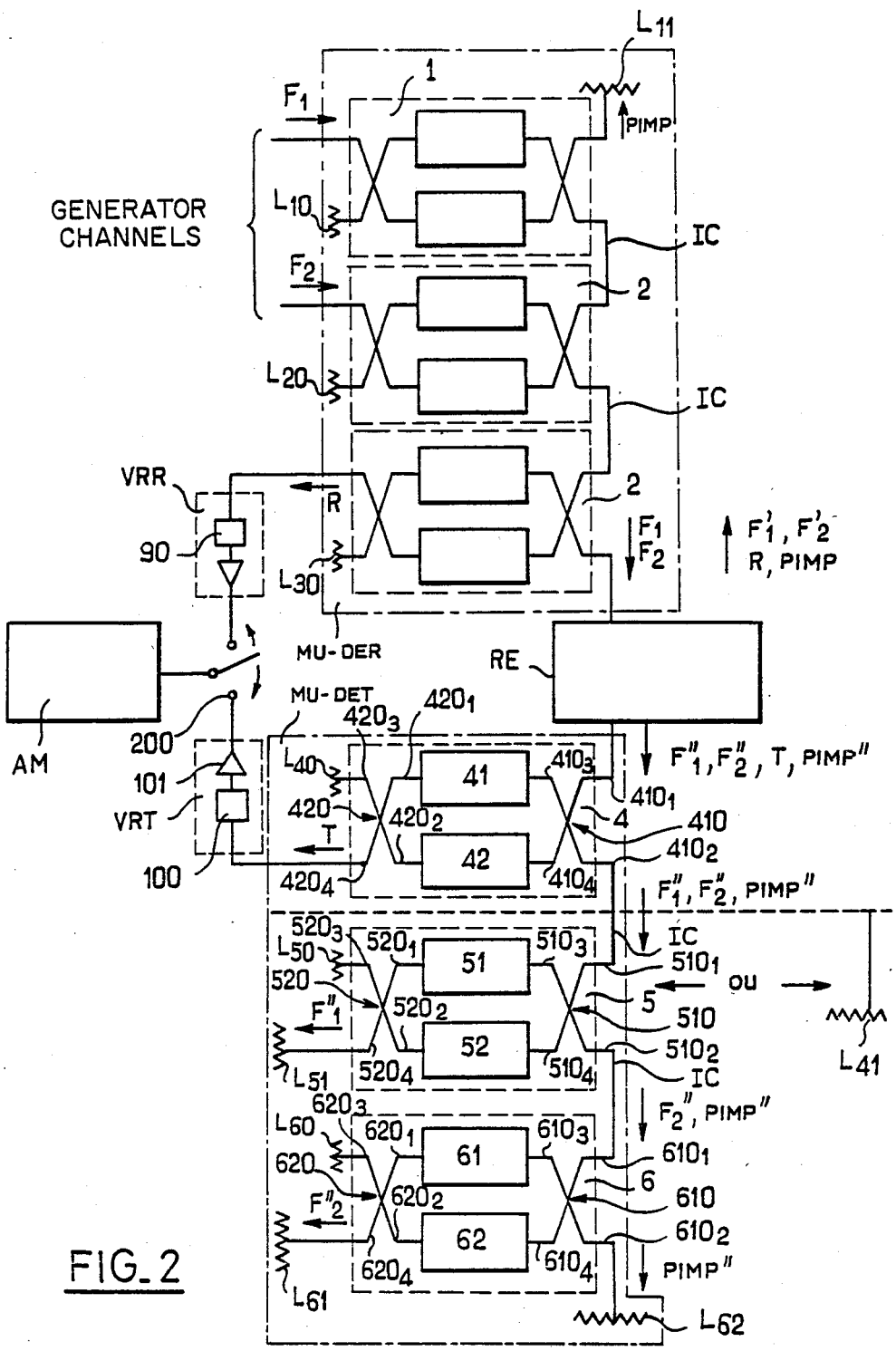
FIG_2

1

DEVICE FOR THE MEASUREMENT OF INTERMODULATION PRODUCTS OF A RECEIVER SYSTEM

BACKGROUND OF THE INVENTION

1. Field of the Invention

The present invention relates to a device for the measurement of intermodulation products of a receiver system.

2. Description of the Prior Art

In the advanced fields of satellite telecommunications or radar electromagnetic detection, it is necessary to be able to measure the intermodulation products of at least two transmitted electromagnetic signals of different frequencies, these signals being received by a receiver system for which it is sought to measure the intermodulation performance characteristics at the above-mentioned frequencies.

Since the maximum, tolerable amplitude or energy values of the intermodulation products are generally very low, these values, for intermodulation product harmonics with frequencies within the reception frequency band of the receiver system, should of course not be greater than the sensitivity of the receiver system or, in a complementary aspect of the matter, the sensitivity of the receiver in its reception frequency band cannot be greater than the energy levels of the intermodulation products in the above-mentioned frequency band. The measuring device itself must, of course, imperatively generate intermodulation energy levels which are very low with reference to the maximum, tolerable levels for a given receiver system.

An object of the device, according to the present invention, for measuring the intermodulation products of a system for receiving at least two transmitted electromagnetic signals of different frequencies, is the application of a device that meets the above-mentioned specifications.

Another object of the measuring device, according to the invention, is the application of a device to measure active or passive intermodulation products.

Another object of the device according to the invention is the application of a device having a modular character, this modular character making it possible to envisage an application of the measuring device, according to the invention, to the measurement, solely by modular extension, of products of intermodulation of more than two transmitted electromagnetic signals.

Another object of the present invention is, finally, the application of a system to measure intermodulation products generated by a receiver system either by reflection wherein, moreover, the receiver system may consist simply of a reflecting material, or by transmission (hereinafter referred to as "transfer") wherein the receiver system may consist wholly or partly of a microwave antenna.

SUMMARY OF THE INVENTION

A distinguishing feature of the device, according to the invention, for measuring intermodulation proucts of a system for receiving at least two transmitted electromagnetic signals of different frequencies is that said device has at least two channels for transmitting at least two transmitted electromagnetic signals. Each channel enables the transmission of one of the signals of given frequency. The device further has a reflective reception channel connected to an apparatus for measuring intermodulation products. The reception channel enables the transmission of the electromagnetic signals in a frequency band centered on the reception frequency band of the receiver system. The two transmission channels, the reception channel and the receiver system are interconnected by means of a reflective reception multiplexer-demultiplexer with directional filters. The inputs/outputs of the reflective reception multiplexer/demultiplexer are respectively connected to the first and second transmission channels, the reflective reception channel and the receiver system, and the multiplexer/demultiplexer has a directional filter associated with each channel. Each directional filter transmits at the frequency of the electromagnetic signals transmitted by the channel with which it is associated, and is reflective at the frequency of the electromagnetic signals of the other channels and the intermodulation products located outside the reception frequency band.

The device, according to the invention, for measuring intermodulation products of a receiver system may be used advantageously in radar electromagnetic detection instruments, satellite telecommunications and, more generally, in the field of data transmission by electromagnetic waves when two or more transmission frequencies are used, and when the reception is done with the same antenna on a reception frequency band shifted with respect to the transmission frequency band.

BRIEF DESCRIPTION OF THE DRAWINGS

The invention will be better understood from the following description and drawings, of which.

DESCRIPTION OF PREFERRED EMBODIMENTS

Figure 1A:
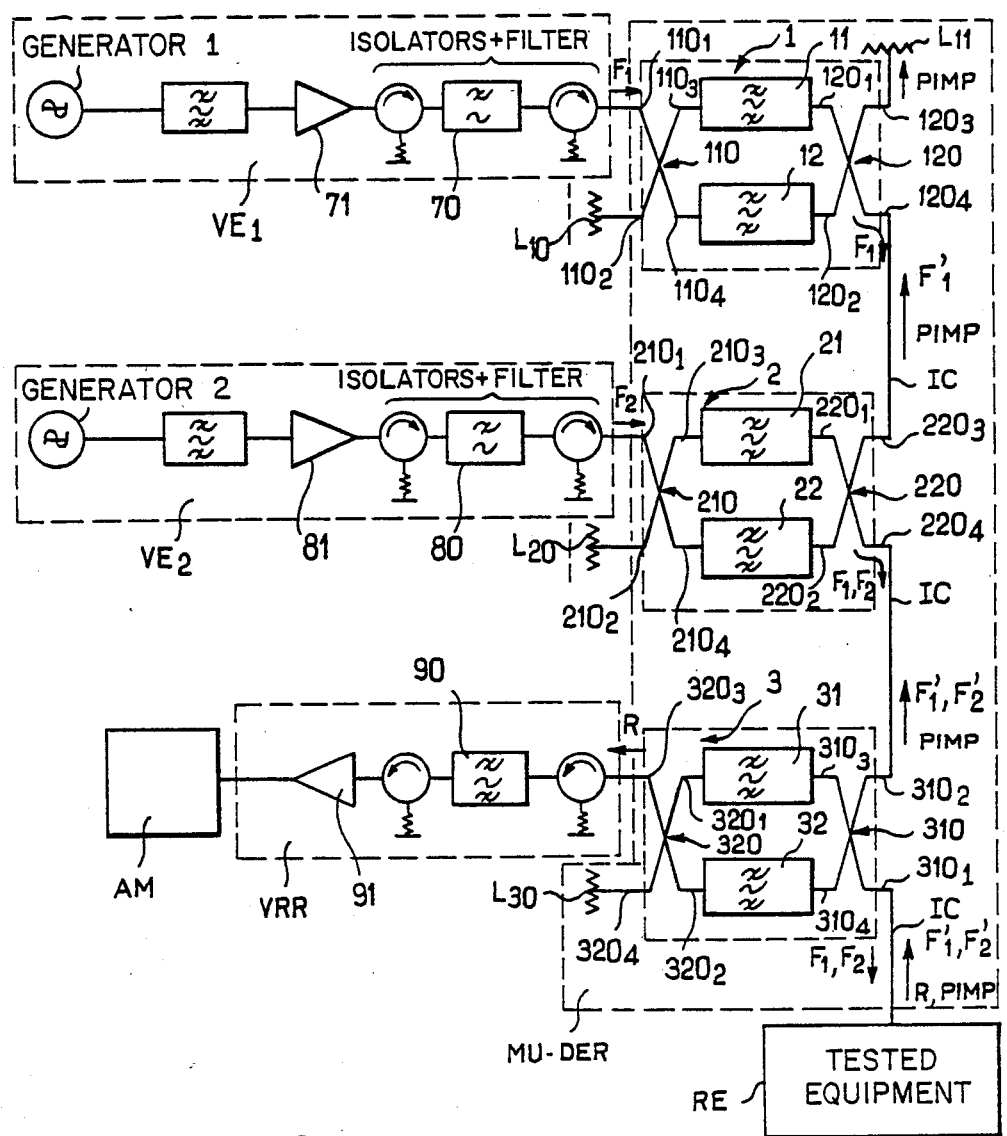
FIG. 1 is a drawing showing the device, according to the invention, for measuring intermodulation products of a receiver system for at least two transmitted electromagnetic signals of different frequencies, according to a first non-restrictive embodiment, more particularly designed for the measuring of intermodulation products generated by the reflective reception system.
FIG. 1b is a drawing showing a constituent element of the device according to the invention, shown in FIG. 1a, FIG. 2 is a drawing of the device, according to the invention, for measuring intermodulation products of a receiver system of at least two transmitted electromagnetic signals, in a second embodiment more especially designed for the measurement of intermodulation products generated by the receiver system by reflection and/or by transmission.

The device for measuring intermodulation products of a receiver system of at least two transmitted electromagnetic signals of different frequencies, according to the invention, shall be described firstly with reference to FIG. 1a.

In the above-mentioned FIG. 1a, the transmitted electromagnetic signals with different frequencies are supposed to have been transmitted at frequencies F1 and F2.

As will be noted in the above-mentioned FIG. 1a, the device according to the invention has at least two transmission channels, VE1 and VE2, transmitting the above-mentioned transmitted electromagnetic signals. Each channel enables the transfer of one of the said signals with frequencies F1 or F2.

Furthermore, as will be also noted in the above-mentioned figure, the device according to the invention has a reflective reception channel VRR connected to an intermodulation products measuring apparatus AM. The reception channel VRR enables the transmission of electromagnetic signals in a frequency band centered on the reception frequency band of the receiver system to be tested, this receiver system being marked RE.

Furthermore, a reflective reception multiplexer/demultiplexer, marked MU-DER, with directional filters, enables the interconnection, firstly, of the two transmission channels VE1, VE2, the reflective reception channel VRR and the receiver system RE. The inputs/outputs of the multiplexer-demultiplexer MU-DER are respectively connected to the first and second transmission channels, VE1, VE2, the reflective reception channel VRR and the receiver system RE. The multiplexer/demultiplexer advantageously has a directional filter 1, 2, 3, associated with each channel. Each of the directional filters 1, 2, 3, is on at the frequency of the electromagnetic signals transmitted by the channel with which it is associated and reflective at the frequency of the electromagnetic signals of the other channels and intermodulation products located outside the reception frequency band of the receiver system RE.

A more detailed description of an advantageous embodiment of the directional filters, such as the directional filters 1, 2, 3, notably forming the reflective reception multiplexer/demultiplexer MU-DER shall be given with reference to FIG. 1b.

The references given with respect to FIG. 1b concern all the embodiments of the first directional filter 1 and the description of the above-mentioned directional filter is valid for all the directional filters 2, 3, and the following ones which could be applied to make the device according to the invention. The first digit of each reference in the usual reading direction corresponds to the order number of the corresponding directional filter, and the description of the directional filters of an order greater than 1 is deduced solely by replacing each reference in this first filter by the corresponding order number of the higher order directional filter. Thus, as a non-restrictive example, the directional filter 1, as shown in FIG. 1b, may advantageously consist of a first hybrid coupler 110, the first input port $110_1$ of which receives the electromagnetic signal of a frequency corresponding to the frequency of the channel considered, namely the electromagnetic signal with frequency F1. The hybrid coupler forming the first hybrid coupler 110 may advantageously consist of a hybrid coupler normally available in the market. On this basis, this hybrid coupler shall not be described in greater detail in the description.

The directional filter 1, as shown in FIG. 1b, also has two identical filters, marked 11 and 12, enabling the transmission of electromagnetic signals in a frequency band centered on the frequency of the channel considered, namely the frequency F1 in the case of the directional filter 1. Each filter 11, 12, is connected respectively to the output port, $110_3$ and $110_4$, of the first hybrid coupler 110.

The directional filter 1, as shown in FIG. 1b, also has a second hybrid coupler 120, each input port, $120_1$ and $120_2$, of which is connected to the output of one of the two identical filters 11, 12. The second output port of the second hybrid coupler 120, namely the output port marked $120_4$, delivers the electromagnetic signal with a frequency corresponding to the frequency of the channel considered, namely the frequency F1. The first output port $120_3$ is connected either to a dissipative load, marked L11 in the case of the first directional filter 1, or to the second output port of the second hybrid coupler of another directional filter, as can be seen particularly with respect to the directional filter 2.

The input port $110_2$ of the first hybrid coupler 110 of the first directional coupler 1 is connected to a dissipative load L10, or L20 in the case of the second input port of the first hybrid coupler 210 of the second directional filter 2, or to the second output port $220_4$ of the second hybrid coupler of another directional filter, in the circumstances the directional filter 2, in the case of the third directional filter comprising the first hybrid coupler 310. It will be understood, of course, that since hybrid couplers have absolutely symmetrical operation, the references relating to the first and second input ports and the first and second output ports may be defined arbitrarily.

Preferably, each identical filter, such as the filters 11 and 12, has a pass-band, the central frequency of which is centered, for example, on the higher transmission frequency half-band and on the lower frequency half-band respectively. The rejection rate of each identical filter may be taken to be equal, for example, to 15 dB. In the same way, with respect to the filters 31 and 32 of the third directional filter 3, these filters have a central frequency centered on the higher reception half-band and on the lower reception half-band.

A more detailed description, with reference to FIG. 1b, of the embodiment of the device of according to the invention shown in FIG. 1a, shall now be given for the embodiment considered, which is capable of providing a measurement of the reflected intermodulation products of the receiver system RE for two transmitted electromagnetic signals of different frequencies, F1 and F2, mentioned above.

In the above-mentioned embodiment, the first input port $110_1$ and the second input port $110_2$ of the first directional filter 1 are respectively connected to the first transmission channel VE1 and to a dissipative load L10. The first output port $120_3$ of the second hybrid coupler 120 of the first directional filter 1 is itself connected to a dissipative load L11.

The first input port $210_1$ and the second input port $210_2$ of the first hybrid coupler 210 of the second directional filter 2 are respectively connected to the second transmission channel VE2 and to a dissipative load L20. The first output port $220_3$ of the second hybrid coupler 220 of the second directional filter 2 is itself connected to the second output port $120_4$ of the second hybrid coupler 120 of the first directional filter 1.

Furthermore, the first input port $310_1$ and the second input port $310_2$ of the first hybrid coupler 310 of the third directional filter 3 are respectivley connected to the receiver system RE to be tested and to the second output port $220_4$ of the second hybrid coupler 220 of the second directional filter 2. The first output port $320_3$ and the second output port $320_4$ of the second hybrid coupler 320 of the third directional filter 3 are respectively connected to the reflective reception channel VRR and to a dissipative load L30.

The operating principle of the measuring device according to the invention, as shown in FIGS. 1a and 1b, is as follows:

The directional filter 1, associated with the transmission channel VE1, consists of band-pass filters centered on the frequency F1, and with pass-bands as narrow as can be compatible with the frequency band to be explored.

The transmitted electromagnetic signal coming from the transmission channel VE1 goes through the directional filter 1 and is transmitted towards the test equipment, namely the receiver system RE.

The directional filter 2 is made up, in the same way, of filters centered on the frequency F2 as mentioned earlier. The pass-bands of the identical filters 11 and 12 and 21 and 22, respectively, constituting the directional filters 1 and 2, are separate in such a way that:

the transmitted electromagnetic signal, of a frequency F1, is reflected to the filters 21, 22 of the directional filter 2 and is transferred towards the tested equipment, the receiver system RE.

the transmitted electromagnetic signal, of a frequency F2, goes through the directional filter 2 and is also transferred towards the tested equipment, the receiver system RE.

In the same way, the directional filter 3, associated with the reflective reception channel VRR, is made up of filters centered on the reception pass-band of the receiver RE, tested on the central frequency FR, the pass-band of which is separate from that of the directional filters 1 and 2.

The frequency F1 and F2 transmitted electromagnetic signals are thus reflected to the directional filter 2 and the directional filter 3, and are thus transferred towards the tested equipment, the receiver system RE. This receiver system RE therefore receives the frequency F1 and F2 transmitted electromagnetic signals and refects them partially. From the transmitted electromagnetic signals F1 and F2, it also generates intermodulation products, namely electromagnetic signals with frequencies of plus or minus mF1 and plus or minus nF1, only the positive values of these frequencies being considered, where m and n are any two whole numbers representing the order of the above-mentioned intermodulation products.

Among these products, a distinction must be made between those for which the frequency falls within the reception band R of the receiver RE forming the tested equipment and those for which the frequency is outside the above-mentioned reception band.

The intermodulation products for which the frequency falls within the reception frequency band are then transferred by the third directional filter 3 and, of course, by the reflective reception channel VRR towards the measuring apparatus AM.

On the contrary, the reflected electromagnetic signals, namely the intermodulation products for which the frequency is outside the reception frequency band R, and the electromagnetic signals of frequencies $F'1$ and $F'2$, generated by pure reflection by the receiver system Re, are first of all reflected by the third directional filter 3, and are therefore transferred in reverse towards the second directional filter 2. The frequency F2 electromagnetic signal, propagated in the above-mentioned reverse direction, is then transferred by the above-mentioned directional filter 2 and is totally absorbed by the dissipative load L20 of this directional filter 2, while the intermodulation products for which the frequency is outside the reception band R and the frequency F1 electromagnetic signal, propagated in the above-mentioned reverse direction, are transferred towards the first directional filter 1. This directional filter 1 transfers the frequency F1 electromagnetic, which is propagated in the opposite direction, towards the dissipative load L10 where the latter is absorbed. Similarly, the intermodulation products for which the frequency is outside the reception band R are, on the contrary, reflected by the first directional filter 1 and transmitted towards the dissipative load L11 in which they are dissipated.

It will be noted, of course, that the device according to the invention, shown in FIG. 1a, enables the measurement of not only the passive intermodulation products generated by reflection but also the active intermodulation products generated, for example, by the receiver RT inasmuch as these active intermodulation products have a higher energy level than the passive intermodulation products.

Another non-restrictive embodiment of the device for measuring the intermodulation products of a receiver system RE of at least two transmitted electromagnetic signals of different frequencies, F1 and F2, shall now be given non-restrictively, with reference to FIG. 2, this device in the above-mentioned embodiment being more especially adapted to a measurement of transferred intermodulation products of the receiver system RE.

In the above-mentioned FIG. 2, it will be noted that the part of the device relating to the measurement of reflective intermodulation products is identical to the embodiment of FIG. 1a and bears quite the same references. However, in order to avoid burdening the drawing, only references relating to the directional filters 1, 2 and 3 have been recalled and those relating to the constituent elements of these filters have not been put in the drawing.

According to the embodiment of FIG. 2, the device according to the invention further comprises at least one transfer reception channel VRT and one transfer reception multiplexer/demultiplexer marked MU-DET. The transfer reception multiplexer/demultiplexer is, of course, a multiplexer/demultiplexer with directional filter as shall be described hereinafter in the description.

The transfer reception multiplexer/demultiplexer shall be described firstly in a first alternative embodiment, as shown in FIG. 2.

As shown in this figure, the transfer reception multiplexer/demultiplexer MU-DET has at least one fourth directional filter 4 which transmits at the frequency band T of the transferred signals of intermodulation products and is reflective at the frequencies, F1 and F2, of the transferred electromagnetic signals, and at the frequencies of the intermodulation products for which the frequency is outside the transfer pass-band T of the receiver system RE.

As can also be seen in FIG. 2, the fourth directional filter 4 has a first hybrid coupler 410, the first input port $410_1$ of which is connected to an intermodulation products transfer output, notably of the receiver system RE, and the second input port $410_2$ of which is connected to a dissipative load L41. FIG. 2 shows the connection between the second input port $410_2$ of the first hybrid coupler 410 of the fourth directional filter 4, shown with dashes inasmuch as the above-mentioned dissipative load L41 may be replaced by a more complete circuit, in the absence of the dissipative load L41, as shall be described further below in the description. The output ports $410_3$ and $410_4$ of the first hybrid coupler 410 of the fourth directional filter 4 are respectively connected to a first and second identical filter, 41, 42, the transfer frequency band of which is centered on the frequency or frequency band of the transfer reception system, namely the frequency band T, of the receiver system RE. The fourth directional filter 4 also has a second hybrid coupler 420, the input ports $420_1$ and $420_2$ of which are respectively connected to an output of the first filter 41 and the second filter 42, and the first output ports, $420_3$ and $420_4$, of which are respectively connected to a dissipative load L40 and to the above-mentioned transfer reception channel VRT.

The following is the operation of the transfer reception multiplexer/demultiplexer MU-DET, similarly to the embodiment of FIG. 1:

the output of the receiver system RE, delivering the transferred signals, delivers the frequency F1, F2 electromagnetic signals and signals of transfer intermodulation products for which the frequency falls within the transfer frequency band of the receiver RE to be tested and other intermodulation products, marked PIMPT, the frequency of which is outside the transfer reception frequency band of the receiver system RE. The directional filter 4 enables solely the transfer of the intermodulation product electromagnetic signals for which the frequency falls within the transfer reception frequency band of the receiver RE, the other above-mentioned electromagnetic signals being reflected by the filters 41 and 42 of the directional filter 4 and being transferred towards the dissipative load L41 in which these signals are dissipated. The intermodulation product electromagnetic signals for which the frequency falls within the reception frequency band T of the receiver RE transferred by the directional filter 4 are then transferred to the transfer reception channel VRT, towards the above-mentioned measuring apparatus AM.

Higher performance characteristics for the device for measuring intermodulation products by transfer, as shown in FIG. 2, can be obtained if a separate dissipation is made of the transfer frequency F1 and F2 electromagnetic signals and the intermodulation products for which the frequency is outside the transfer reception frequency band T.

To this end, as also shown in FIG. 2, the dissipative load L41 may be replaced by a specialized circuit which complements the above-mentioned transfer reception multiplexer/demultiplexer MU-DET.

In order to constitute it, the above-mentioned specialized circuit also has additional directional filters. The transfer reception multiplexer/demultiplexer further has a fifth directional filter 5 which transmits in the frequency band F1, corresponding to the first transmission frequency F1, and is reflective in all the other considered frequency bands of the electromagnetic signals received in transfer. It also has a sixth directional filter 6 which transmits in the frequency band F2, corresponding to the second transmission frequency F2, and is reflective in all the other frequency bands of the electromagnetic signals received in transfer.

In order to make the fifth directional filter 5, as shown in FIG. 2, this fifth filter 5 may comprise a first hybrid coupler 510, the first input port $510_1$ of which is connected to the second input port $410_2$ of the first hybrid circuit 410 of the fourth directional filter, the dissipative load L41 being eliminated. The fifth directional filter 5 further has two identical filters 51, 52, the pass-band of which is centered on the frequency F1, these filters being connected, respectively, to the first and second input ports, $510_3$ and $510_4$, of the first hybrid coupler 510. Finally, the fifth directional filter 5 has a second hybrid coupler 520, the input ports $520_1$ and $520_2$ of which are respectively connected to an output of each identical filter, and the output ports, $520_3$ and $520_4$ of which are respectively connected to a dissipative load marked L50 and L51.

Similarly, as shown in FIG. 2, the sixth directional filter 6 advantageously has a first hybrid coupler 610, the first input port $610_1$ of which is connected to the second input port $510_2$ of the first hybrid circuit 510 of the fifth directional filter 5, and the second input port $610_2$ of which is connected to a dissipative load L62. The sixth directional filter 6 also has two identical filters 61, 62, the pass-band of which is centered on the frequency F1, these identical filters 61, 62, being connected, respectively, to the first and second input ports, $610_3$ and $610_4$, of the first hybrid coupler 610. The directional filter 6, constituting the sixth directional filter, also has a second hybrid coupler 620, the input ports $620_1$ and $620_2$ of which ar respectively connected to an output of each of the two identical filters 61, 62, and the output ports, $620_3$ and $620_4$ of which are themselves respectively connected to a dissipative load marked L60 and L61.

It will be understood, of course, that since the fifth directional filter 5 transfers the frequency F1 electromagnetic signal, this signal is transferred towards the dissipative load L51 in which it is dissipated. On the contrary, the other electromagnetic signals of differnt frequencies, received in transfer, are reflected by the fifth directional filter 5 and transferred towards the sixth directional filter 6. This directional filter 6, enabling the transfer of the frequency F2 electromagnetic signal received in transmission, leads it towards the dissipated load L61 in which it is dissipated in turn.

The intermodulation product electromagnetic signals for which the frequency is outside the transfer reception pass-band T are reflected by the sixth directional filter 6 and transferred towards the dissipative load L62 in which they are also dissipated.

Of course, the identical filters, 41, 42, 51, 52, and 61, 62, respectively, may also be formed similarly to the identical filters 11, 12, 21, 22, 31, 32 described earlier, the central frequency of the transfer bands of the filters being obviously matched accordingly if need be.

To enable easier application of the device according to the invention, as embodied in either FIG. 1a or FIG. 2, the transmission channels VE1, VE2, the reflective reception channel VRR and the transfer reception channel VRT may have filtering means and means to amplify the filtered signal. The filtering means are respectively marked 70, 80, 90 and 100 in FIGS. 1a and 2. They may advantageously consist of standard technology comb filters. However, in order to reduce, to the maximum extent, the intermodulation products liable to be generated by the measuring device itself, it will be advantageous, particularly of the making of the above-mentioned filters, to form them by means of cavity resonators having interlaced fingers, the constituent material of both the walls of the cavity resonator and the fingers being formed advantageously by a coating of precious metal such as gold or silver. For, it has been obsrved that the use of precious metals instead of conventional metals such as nickel or aluminum provides a substantial reduction in the level of the electromagnetic intermodulation signals generated by the measuring device itself.

Furthermore, when the device according to the invention, as shown in FIGS. 1a and 2, is designed to make measurements for transmission frequencies F1, F2 lower than about 1000 MHz, the interconnection, marked IC in FIGS. 1a and 2, among the various elements may advantageously be achieved by means of coaxial cables. On the contrary, when the measuring device according to the invention is designed for use at transmission frequencies higher than 1200 MHz, the interconnection IC among the various elements may be advantageously achieved in the form of a soldered waveguide in order to obtain more efficient conditions for the propagation of the signals without the risk of additional intermodulation products generated by the measuring device itself.

Furthermore, and in a standard way, the amplifier means, marked 71, 81, 91 and 101, can be made with amplifiers matched with the corresponding frequencies of the above-mentioned transfer channels and the connection, particularly of the filters 70, 80, 90 and 100, may be achieved by means of insulators consisting of circulators as shown schematically in FIG. 1 in particular. These elements shall not be described because they form part of prior art devices in microwave technology.

Furthermore, to provide greater flexibility in the use of the device, according to the invention, for measuring intermodulation products, the reflective reception channel VRR and the transfer reception channel VRT may be connected to the measuring apparatus AM by means of a change-over switch 200. The change-over switch 200 is of a standard type and shall not be described. It may consist of a device with a magic T junction or a similar device.

A description has thus been given of a particularly advantageous device to measure intermodulation products of a receiver system for at least two transmitted electromagnetic signals of different frequencies. For, owing to the modular character of the device according to the invention, described in relation to FIGS. 1a and 2, it is of course possible to extend the operating mode of the above-mentioned device to any number of transmitting and receiving channels, and it is possible to envisage any number of transmitting frequencies and a corresponding number of reception channels, both at the reflective receiver multiplexer-demultiplexer MU-DER and at the transfer reception multiplexer-demultiplexer MU-DET, it being possible to match these channels with different frequency bands. For, as will be easily understood, this modification can be made by only adding a corresponding transmission or reception channel with which, of course, there is associated a directional filter with matched frequency.

Furthermore, the value of the measuring device according to the invention is seen particularly in the fact that the filters are crossed by only one high-power signal at the most, these signals being capable of attaining power values of the order of 10 Watts thus removing a major possibility of the creation of active or passive intermodulation products by the testing stand itself.

It will be further noted that the above-described channels and their associated directional filters can be arranged in any order without difficulty. The addition of high-power signals, namely transmitted electromagnetic signals with frequencies F1 and F2, is done by reflection on the first encountered higher order directional filters, namely the directional filter 2 in the case of FIG. 1a and FIG. 1b, in the corresponding hybrid coupler and in the transfer line by means of the interconnection IC interconnected with the receiver system RE to be tested. The elements concerned are simple and may be manufactured so as to reduce the intermodulation products, which they are themselves liable to generate, to the minimum. Should the power of the transmitted electromagnetic signals of frequencies F1 and F2 be low, it may suffice to make the interconnections with coaxial cables.

Furthermore, the measuring device according to the invention is matched with all frequencies when this device is considered from the viewpoint of its access to the measuring apparatus AM. This measuring apparatus AM may, besides, advantageously consist of a spectrum analyzer. This makes it possible to ensure that no overvoltage will disturb the measurements in modifying the value sof the direclty measured intermodulation products or through non-measured intermodulation products, namely intermodulation products for which the frequency falls outside the reflective reception or transfer reception frequency band. The high-power signals reflected by the tested receiver system RE are each dissipated separately in the loads of the insulator circuits or in the power amplifiers of the transmission channels VT1 and VT2, thus ensuring that they will not create new intermodulation products.

The non-measured intermodulation products, namely those for which the frequency falls outside the above-mentioned reflective reception of transfer reception frequency band are dissipated in separate loads as described above so that they do not disturb the measurement.

In the preferred embodiment of FIG. 2, the high-power signals, namely the transmitted signals with frequencies F1 and F2, and the transferred non-measured intermodulation products are, far more advantageously, dissipated in separate loads so that they do not disturb the measurement. Finally, it will be noted that in the case of FIG. 2, the dissipative loads, L51 and L61, as also, of course, the dissipative load L62, consist of power loads while the loads L40, L50, L60 are, on the contrary, formed by loads that enable the impedance matching of the corresponding hybrid circuits.

What is claimed is:

1. A device for the measurement of intermodulation products of a receiver system of at least two transmitted electromagnetic signals of different frequencies said device comprising:
    at least two transmission channels for said transmitted electromagnetic signals, each channel enabling the transfer of one of said signals of different frequencies;
    a reflective reception channel connected to an apparatus for the measurement of intermodulation products, said reception channel enabling the transfer of electromagnetic signals in a frequency band centered on the reception frequency band of said receiver;
    a reflective reception multiplexer/demultiplexer with directional filters, the inputs/outputs of which are respectively connected to said first and second transmission channels, to the reflective reception channel and to said receiver system, said multiplexer/demultiplexer comprising a directional filter associated with each channel, each of said directional filters transmitting at the frequency of the electromagnetic signals transferred by the channel with which it is associated and being reflective at the frequency of the electromagnetic signals of the other channels and of the intermodulation products located outside the reception frequency band.

2. A device according to claim 1, wherein said directional filters are constituted by:
- a first hybrid coupler, the first input port of which receives the electromagnetic signal of a frequency corresponding to the frequency of the channel considered;
- two identical filters enabling the transfer of electromagnetic signals in a frequency band centered on the frequency of the channel considered, each filter being connected respectively to the output port of the first hybrid coupler;
- a second hybrid coupler, each input port of which is connected to the output of one of the two identical filters, and the second output port of which delivers the electromagnetic signal of a frequency corresponding to the frequency of the channel considered, and the first output port of which is connected either to a dissipative load or to the second output port of the second hybrid coupler of another directional filter, the second input port of the first hybrid coupler being connected either to a dissipative load or to the second output port of the second hybrid coupler of another directional filter.

3. A device according to claim 2, wherein, in order to ensure a measurement of reflective intermodulation products of said receiver system for two transmitted electromagnetic signals of different frequencies:
- the first and second input ports of the first hybrid coupler of the first directional filter are respectively connected to the first transmission channel and to a dissipative load, the first output port of the second hybrid coupler of said first directional filter being connected to a dissipative load;
- the first and second input ports of the first hybrid coupler of the second directional filter are respectively connected to the second transmission channel and to a dissipative load, the first output port of the second hybrid coupler of the second directional filter being connected to the second output port of the second hybrid coupler of the first directional filer;
- the first and second input ports of the first hybrid coupler of the third directional filter are respectively connected to the receiver system to be tested and at the second output port of the second hybrid coupler of the second directional filter, the first and second output ports of the second hybrid coupler of the third directional filter being respectively connected to the reflective reception channel and to a dissipative load.

4. A device according to claim 2, wherein, in order to ensure a measurement of transferred intermodulation products of said receiver system for two transmitted electromagnetic signals of different frequencies, said device further comprises a transfer reception channel and a transfer reception multiplexer/demultiplexer with directional filters.

5. A device according to claim 4, wherein said transfer reception multiplexer/demultiplexer with directional filters has at least one fourth directional filter which transmits in the frequency band of the transferred intermodulation product signals and is reflective at the frequency of the transferred signals and of the intermodulation products outside the transfer band.

6. A device according to claim 5, wherein said fourth directional filter comprises:
- a first hybrid coupler, the first input port of which is connected to an output of intermodulation products of the receiver system, and the second input port of which is connected to a dissipative load, the output ports of the first hybrid coupler being connected respectively to a first filter and a second filter, identical to each other, the transferred frequency band of which is centered on the transfer frequency band or frequency of the receiver system;
- a second hybrid coupler, the input ports of which are respectively connected to an output of said first and second filters, and the first and second output port of which are respectively connected to a dissipative load and to said transfer reception channel.

7. A device according to claim 5 wherein said transfer reception multiplexer/demultiplexer with directional filters further comprises:
- a fifth directional filter which transmits in the frequency band corresponding to the first transmission frequency and is reflective in all the other frequency bands;
- a sixth directional filter which transmits in the frequency band corresponding to the second transmission frequency and is reflective in all the other frequency bands.

8. A device according to claim 7, wherein said fifth directional filter of said transfer reception multiplexer/demultiplexer comprises:
- a first hybrid coupler, the input port of which is connected to the second input port of the first hybrid circuit of the fourth directional filter, the dissipative load being eliminated;
- two identical filters, the pass-band of which is centered on the frequency band, corresponding to the first transmission frequency, respectively connected to the first and second input ports of said first hybrid coupler of said fifth directional filter;
- a second hybrid coupler, the input ports of which are respectively connected to an output of each identical filter and the output ports of which are themselves respectively connected to a dissipative load; and wherein said sixth directional filter of said transfer reception multiplexer/demultiplexer comprises:
- a first hybrid coupler, the first input port of which is connected to the second input port of the first hybrid coupler of said firth directional filter, and the second input port of which is connected to a dissipative load;
- two identical filters, the pass-band of which is centered on the frequency band, corresponding to the second transmission frequency, respectively connected to the first and second output ports of said first hybrid coupler of said sixth directional filter; and
- a second hybrid coupler, the input ports of which are respectively connected to an output of each of the two identical filers of said sixth directional filter and the output ports of which are themselves respectively connected to a dissipative load.

9. A device according to claim 4, wherein said transmission channels, said reflective reception channel and said transfer reception channel comprise filtering means and means to amplify the filtered signal.

10. A device according to claim 9, wherein said filtering means are constituted by a comb filter.

11. A device according to claim 1, wherein, for transmission frequencies lower than about 1000 MHz, the interconnection of the various elements is achieved by means of coaxial cables.

12. A device according to claim 1, wherein, for transmission frequencies higher than 1200 MHz, the interconnection of the various elements is achieved in waveguide form.

13. A device according to claim 4, wherein the reflective reception channel and the transfer reception channel are connected to said measuring apparatus by means of a change-over switch.

14. The use of a measuring device according to claim 1 to measure intermodulation products of a receiver such as a radar receiver antenna or a satellite telecommunications antenna.

* * * * *